(12) United States Patent
Fujita et al.

(10) Patent No.: US 8,258,673 B2
(45) Date of Patent: Sep. 4, 2012

(54) SEMICONDUCTOR DEVICE AND METHOD OF FABRICATING THE SEMICONDUCTOR DEVICE

(75) Inventors: Toma Fujita, Kyoto (JP); Haruhiko Nishikage, Kyoto (JP); Hironobu Kawauchi, Kyoto (JP)

(73) Assignee: Rohm Co., Ltd., Kyoto-fu (JP)

( * ) Notice: Subject to any disclaimer, the term of this patent is extended or adjusted under 35 U.S.C. 154(b) by 107 days.

(21) Appl. No.: 12/817,674

(22) Filed: Jun. 17, 2010

(65) Prior Publication Data
US 2010/0320873 A1  Dec. 23, 2010

(30) Foreign Application Priority Data

Jun. 18, 2009 (JP) ................................ P2009-145319
May 25, 2010 (JP) ................................ P2010-119283

(51) Int. Cl.
*H02N 1/00* (2006.01)

(52) U.S. Cl. ....................................................... 310/309

(58) Field of Classification Search .................... 310/309
See application file for complete search history.

(56) References Cited

U.S. PATENT DOCUMENTS

| 6,078,016 A * | 6/2000 | Yoshikawa et al. ........... 200/181 |
| 7,067,344 B1 * | 6/2006 | Oguchi ........................... 438/53 |
| 2005/0162811 A1 * | 7/2005 | Obi et al. ...................... 361/437 |
| 2008/0224319 A1 * | 9/2008 | Nakamura ..................... 257/758 |

FOREIGN PATENT DOCUMENTS

| JP | 11-201984 A | * | 7/1999 |
| JP | 2002-221533 A | * | 8/2002 |
| JP | 3367113 | | 11/2002 |

* cited by examiner

*Primary Examiner* — Thomas Dougherty
(74) *Attorney, Agent, or Firm* — Fish & Richardson P.C.

(57) ABSTRACT

There are disclosed a semiconductor device in which a short circuit between an oscillator and a semiconductor substrate is prevented, the semiconductor device being capable of suppressing an increase of fabrication steps, and a method of fabricating the semiconductor device. The semiconductor device includes: a semiconductor substrate, in which a recessed portion is formed on an upper surface, and a semiconductor layer is exposed to a bottom surface of the recessed portion; an oscillator that has a beam-type movable electrode arranged in the recessed portion, the movable electrode having insulating films arranged on side surfaces and lower surface thereof, and is fixed to the semiconductor substrate at a position apart from the movable electrode; and a beam-type fixed electrode that is arranged in the recessed portion so as to be opposed to the movable electrode, and is fixed to the semiconductor substrate so as to be electrically isolated from the movable electrode.

14 Claims, 9 Drawing Sheets

SEMICONDUCTOR DEVICE AND METHOD OF FABRICATING THE SEMICONDUCTOR DEVICE

CROSS REFERENCE TO RELATED APPLICATIONS AND INCORPORATION BY REFERENCE

This application is based upon and claims the benefits of priority from prior Japanese Patent Applications Nos. P2009-145319 and P2010-119283 filed on Jun. 18, 2009 and May 25, 2010, respectively, the entire contents of which are incorporated herein by reference.

TECHNICAL FIELD

The present invention relates to a semiconductor device including a beam-type oscillator, and to a method of fabricating the semiconductor device.

BACKGROUND ART

A semiconductor device such as a micro electro mechanical system (MEMS) device including a beam-type oscillator, a surface acoustic wave (SAW) device and a film bulk acoustic resonator (FBAR) using a piezoelectric material is used for an acceleration sensor, a gyro sensor and the like. For example, an electrostatic capacitance type acceleration sensor that detects an acceleration by sensing a change of electrostatic capacitance between an oscillator as a movable electrode and a fixed electrode fixed to a substrate, and the like are put into practical use.

In a semiconductor device in which an oscillator is arranged in a recessed portion formed on a surface of a semiconductor substrate, the oscillator that has oscillated sometimes contacts the semiconductor substrate located below the oscillator. In this case, when an insulating film is not arranged on a lower surface of the oscillator, the oscillator and the semiconductor substrate electrically short-circuit with each other, are fixedly adhered to each other, and so on. Therefore, a method of covering the entire periphery of the oscillator with the insulating film is proposed (for example, refer to Patent Literature 1). In the method described above, the semiconductor substrate to which the oscillator having the entire periphery thus coated with the insulating film is fixed is pasted to an opposite substrate, whereby a semiconductor device is fabricated.

CITATION LIST

Patent Literature 1: Japanese Patent No. 3367113

SUMMARY OF THE INVENTION

Technical Problem

However, in the foregoing method, a step of pasting the semiconductor substrate and the opposite substrate to each other is required, and further, a forming step and patterning step of a sacrifice layer for spacing the oscillator and the opposite substrate apart from each other are required. Therefore, there has been a problem that fabrication steps are increased.

It is an object of the present invention to provide a semiconductor device in which the short circuit between the oscillator and the semiconductor substrate is prevented, the semiconductor device being capable of suppressing the increase of the fabrication steps, and to provide a method of fabricating the semiconductor device.

Solution to Problem

In accordance with an aspect of the present invention, a semiconductor device is provided, which includes: a semiconductor substrate, in which a recessed portion is formed on an upper surface, and a semiconductor layer is exposed to a bottom surface of the recessed portion; an oscillator that has a beam-type movable electrode arranged in the recessed portion so as to be opposed to a surface of the semiconductor layer, the movable electrode having insulating films arranged on side surfaces and lower surface thereof, and is fixed to the semiconductor substrate at a position apart from the movable electrode; and a beam-type fixed electrode that is arranged in the recessed portion so as to be opposed to the movable electrode and the surface of the semiconductor layer, and is fixed to the semiconductor substrate so as to be electrically isolated from the movable electrode.

In accordance with another aspect of the present invention, a method of fabricating a semiconductor device including an oscillator that has a movable electrode, and a fixed electrode fixed to a semiconductor substrate so as to be opposed to the movable electrode is provided, which includes the steps of: stacking a lower semiconductor layer, an interlayer insulating layer and an upper semiconductor layer on one another, and forming the semiconductor substrate; forming a side trench by etching a part of the upper semiconductor layer, and exposing side surfaces of the oscillator and the fixed electrode; forming a side insulating film on the side surfaces of the oscillator and the fixed electrode; removing the interlayer insulating layer exposed to a bottom portion of the side trench, exposing a surface of the lower semiconductor layer, and leaving, as lower insulating films, the interlayer insulating layer located on lower surfaces of the oscillator and the fixed electrode; and etching a part of an upper surface of the lower semiconductor layer by isotropic etching using the side insulating film and the lower insulating films as masks, and forming the oscillator and the fixed electrode in a recessed portion formed in the semiconductor substrate.

Advantageous Effects of Invention

In accordance with the present invention, it is possible to provide the semiconductor device in which the short circuit between the oscillator and the semiconductor substrate is prevented, the semiconductor device being capable of suppressing the increase of the fabrication steps, and to provide the method of fabricating the semiconductor device.

DESCRIPTION OF EMBODIMENTS

Figure 1:
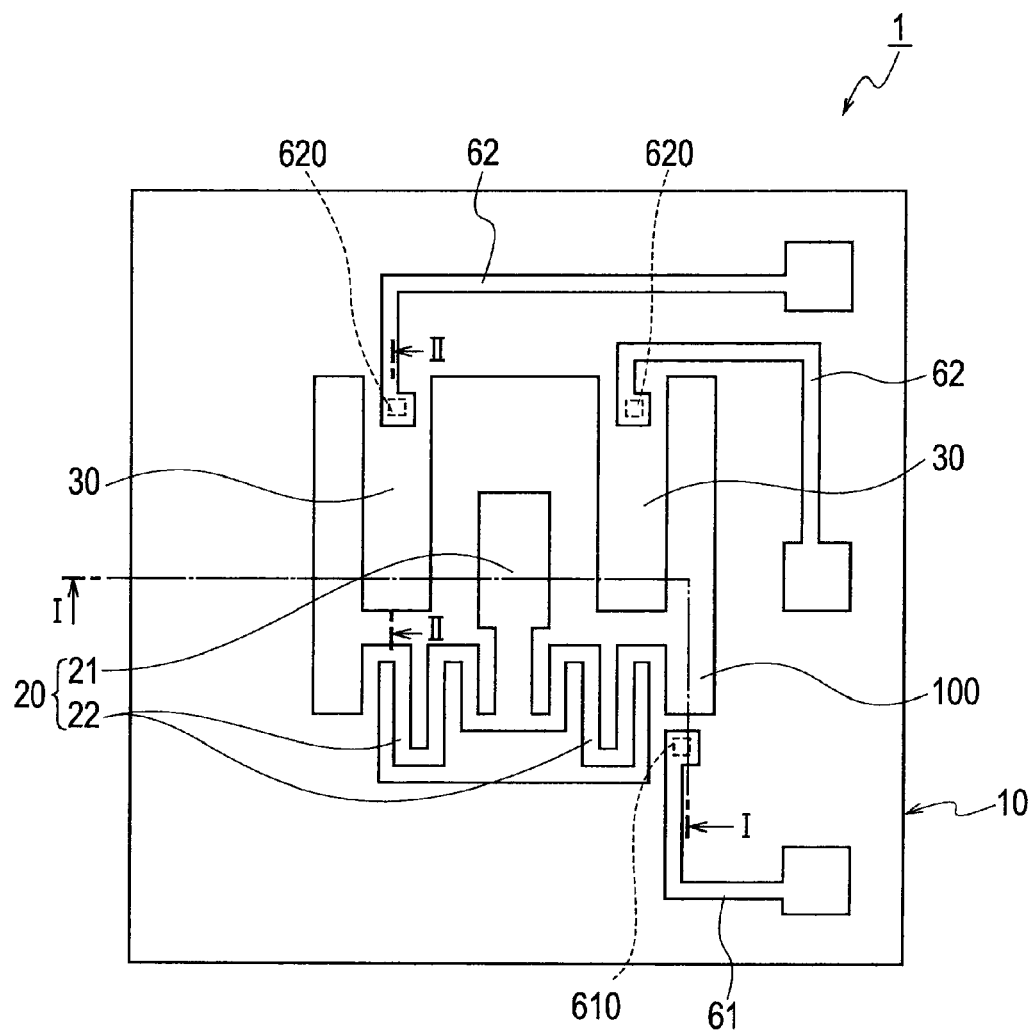
FIG. 1 is a schematic plan view showing a configuration of a semiconductor device according to an embodiment.

Next, a description is made of an embodiment with reference to the drawings. In the following description referring to the drawings, the same or similar reference numerals are assigned to the same or similar portions. However, the drawings are schematic, and it should be noted that a relationship between thicknesses and planar dimensions, a ratio of thicknesses of the respective layers, and the like are different from the actual ones. Hence, specific thicknesses and dimensions should be determined in consideration of the following description. Moreover, it is a matter of course that portions different in dimensional relationship and ratio are also included among the respective drawings.

Moreover, the embodiment to be described below illustrates devices and methods, which are for embodying the technical idea of this invention, and the embodiment of this invention does not specify materials, shapes, structures, arrangements and the like of constituent components to those in the following description. The embodiment of this invention can be modified in various ways within the scope of claims.

Figure 2:
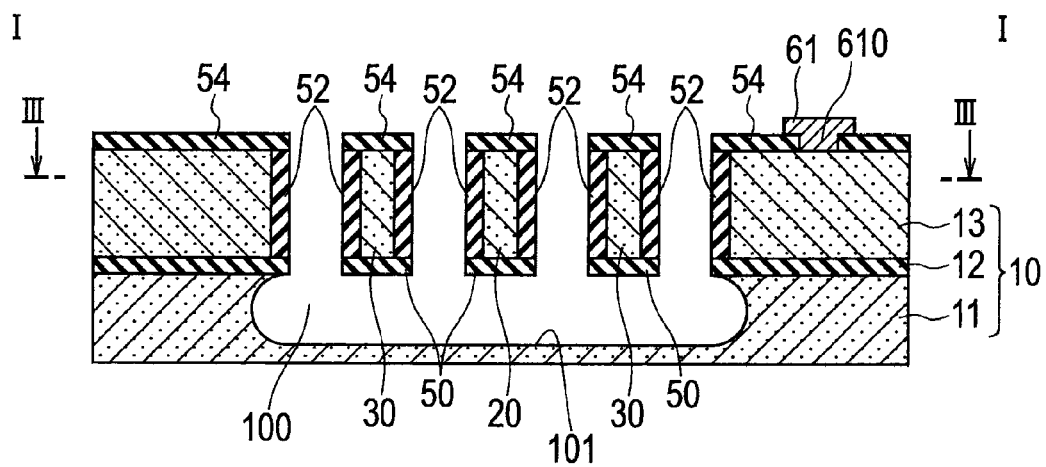
FIG. 2 is a schematic cross-sectional structure view along a line I-I of FIG. 1.

A schematic planar configuration of a semiconductor device 1 according to the embodiment is illustrated as shown in FIG. 1, and a schematic cross-sectional structure along a line I-I of FIG. 1 is illustrated as shown in FIG. 2.

As shown in FIG. 1 and FIG. 2, the semiconductor device 1 according to the embodiment includes: a semiconductor substrate 10, in which a recessed portion 100 is formed on an upper surface, and a semiconductor layer is exposed on a bottom surface of the recessed portion 100; an oscillator 20 that has a beam-type movable electrode 21 arranged in the recessed portion 100, the movable electrode 21 having insulating films arranged on side surfaces and lower surface thereof, and is fixed to the semiconductor substrate 10 at a position apart from the movable electrode 21; and beam-type fixed electrodes 30 which are arranged in the recessed portion 100 so as to be opposed to the movable electrode 21, and are fixed to the semiconductor substrate 10 so as to be electrically isolated from the movable electrode 21.

As shown in FIG. 1, the oscillator 20 is a beam-type oscillator including: the movable electrode 21 that extends to a center portion of the recessed portion 100, and is opposed to the fixed electrodes 30; and spring portions 22 fixed to the semiconductor substrate 10 at positions apart from positions opposed to the fixed electrodes 30. The oscillator 20 and the semiconductor substrate 10 are connected to each other by the spring-like spring portions 22 having flexibility, whereby it is facilitated for the movable electrode 21 to oscillate. In such a way, detection sensitivity of the semiconductor device 1 is enhanced. In the embodiment shown in FIG. 1, the oscillator 20 and the semiconductor substrate 10 are connected to each other, whereby two spring portions 22 which meander in an up-and-down direction of a page surface of FIG. 1. Therefore, the oscillator 20 is likely to oscillate in a right-and-left direction of the page surface, and in accordance with the semiconductor device 1, external force applied in the right-and-left direction of FIG. 1 is mainly sensed.

As shown in FIG. 2, a lower insulating film 50 is arranged on the lower surface of the movable electrode 21. Moreover, a side insulating film 52 is arranged on the side surfaces of the movable electrode 21, and an upper insulating film 54 is arranged on an upper surface thereof, whereby the entire periphery of the movable electrode 21 is covered with the insulating films.

The fixed electrodes 30 have a shape of beams including: fixed ends fixed to the semiconductor substrate at a peripheral portion surrounding the recessed portion 100; and free ends extending in the recessed portion 100. As shown in FIG. 2, lower insulating films 50 are arranged on lower surfaces of the fixed electrodes 30, the side insulating film 52 is arranged on side surfaces thereof, and the upper insulating films 54 are arranged on upper surfaces thereof, whereby the entire peripheries of the fixed electrodes 30 are covered with the insulating films.

Figure 3:
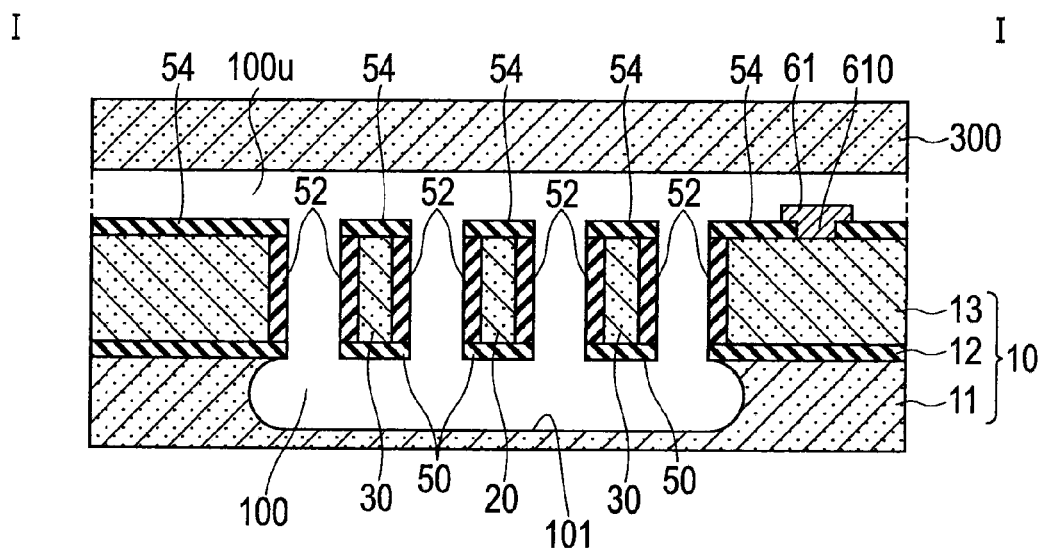
FIG. 3 is a schematic cross-sectional structure view along the line I-I of FIG. 1, in which a cover film is further provided.

A schematic cross-sectional structure along the line I-I of FIG. 1, in which a cover film 300 is further provided, is illustrated as shown in FIG. 3.

Figure 4:
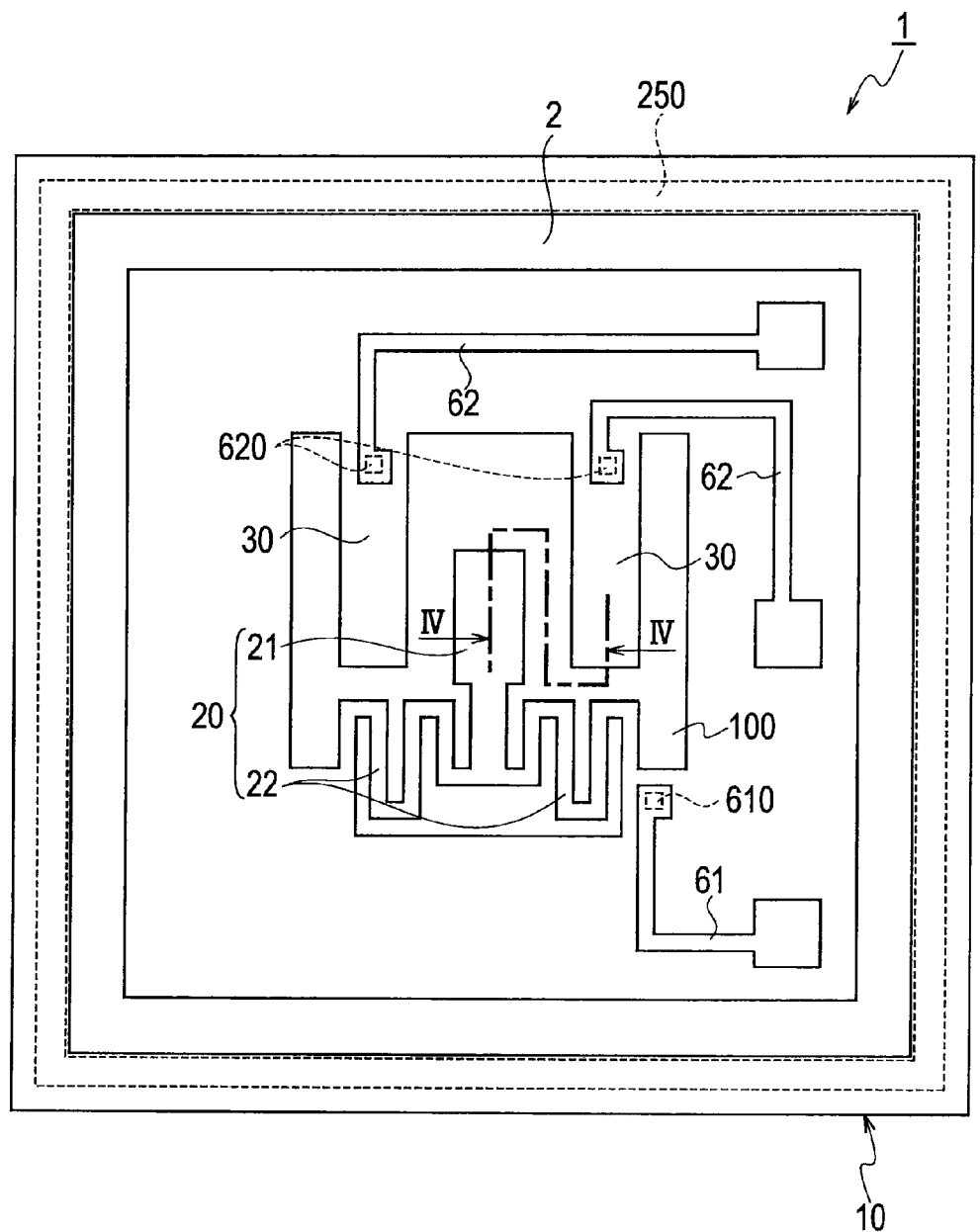
FIG. 4 is a schematic plan view showing a configuration of the semiconductor device according to the embodiment, in which a signal processing circuit mounting portion is provided on a peripheral portion.

A schematic plan view showing a configuration of the semiconductor device according to the embodiment, in which a signal processing circuit mounting portion 2 is provided on a peripheral portion, is illustrated as shown in FIG. 4. In the semiconductor device 1 according to the embodiment, which is shown in FIG. 4, a semiconductor device 1 that composes an acceleration sensor and a signal processing circuit are formed in one chip. FIG. 4 shows a plan view of a state where the cover film 300 is detached. Note that the acceleration sensor and the signal processing circuit may be formed in separate chips, and may be formed as a hybrid integrated circuit.

As shown in FIG. 3 and FIG. 4, the cover film 300 is arranged on an upper portion of the semiconductor device 1 while interposing an insulating layer 250 therebetween at the peripheral portion of the semiconductor substrate 10, whereby the semiconductor device 1 is sealed. The recessed portion 100 may be evacuated to vacuum, or nitrogen gas, Ar gas or the like may be hermetically sealed thereinto. Here, the insulating layer 250 is a layer for adhering the semiconductor substrate 10 and the cover film 300 to each other. Moreover, as a material of the cover film 300, a substrate of a semiconductor such as silicon or a substrate of an insulator such as glass is applicable.

Figure 5:
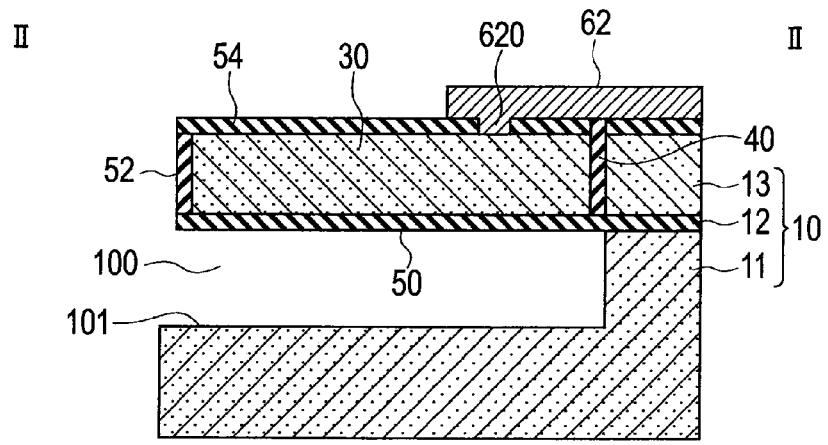
FIG. 5 is a schematic cross-sectional structure view along a line II-II of FIG. 1.
Figure 6:
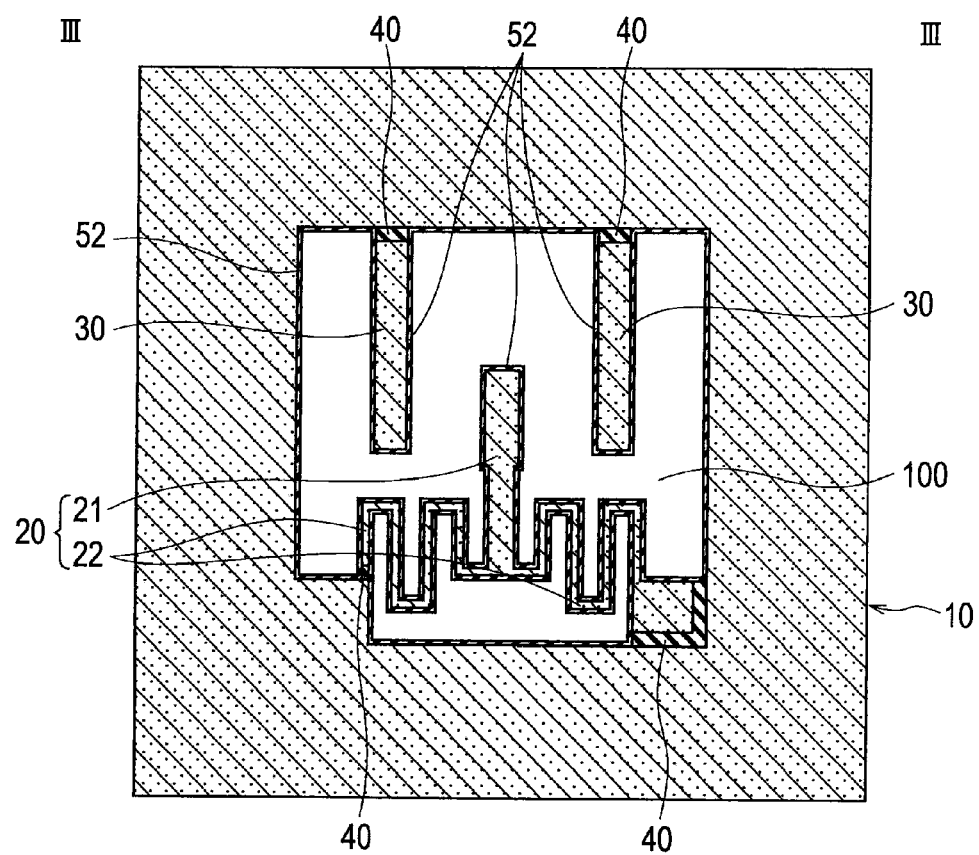
FIG. 6 is a schematic cross-sectional structure view along a line III-III of FIG. 2.

A schematic cross-sectional structure along a line II-II of FIG. 1 is illustrated as shown in FIG. 5, and a schematic cross-sectional structure along a line III-III of FIG. 2 is illustrated as shown in FIG. 6.

As shown in FIG. 5, an insulating isolation region 40 is formed between the fixed end and free end of the fixed electrode 30. Moreover, as shown in FIG. 6, the oscillator is fixed to the semiconductor substrate 10 while interposing insulating isolation regions 40 therebetween. By the insulating isolation regions 40, the movable electrode 21 and the fixed electrodes 30 are electrically insulated from each other. Therefore, the movable electrode 21 and the fixed electrodes 30 function as capacitor plates.

As shown in FIG. 2, the semiconductor substrate 10 is a stacked body of a lower semiconductor layer 11, an interlayer insulating layer 12 and an upper semiconductor layer 13. For the lower semiconductor layer 11, a silicon film is adoptable. For the interlayer insulating layer 12, a silicon oxide ($SiO_2$) film or a stacked body of the $SiO_2$ film and a silicon nitride (SiN) film is adoptable. For the upper semiconductor layer 13, the silicon film or a polysilicon film is adoptable.

The recessed portion 100 is formed by partially etching the upper semiconductor layer 13, the interlayer insulating layer 12 and the lower semiconductor layer 11. Therefore, a part of the lower semiconductor layer 11 is exposed to a bottom surface 101 of the recessed portion 100. For example, in the case where the silicon layer is adopted for the lower semiconductor layer 11, the silicon layer is exposed to the bottom surface 101 of the recessed portion 100. As described later, the semiconductor substrate 10 is processed, whereby the oscillator 20 and the fixed electrodes 30 are formed. Then, a part of the upper semiconductor layer 13 is used as the movable electrode 21 and the fixed electrodes 30. Moreover, a part of the interlayer insulating layer 12 is used as the lower insulating films 50.

A position of the oscillator 20 is changed in response to the external force applied to the semiconductor device 1 from the outside, and distances between the movable electrode 21 and the fixed electrodes 30 are changed. Therefore, when the external force is applied to the semiconductor device 1 in a state where a voltage is applied between the movable electrode 21 and the fixed electrodes 30, changes of the distances between the movable electrode 21 and the fixed electrodes 30 are sensed as a change of electrostatic capacitance. The semiconductor device 1 transmits the sensed change of the electrostatic capacitance to a signal processing circuit (not shown) by a detection signal. The signal processing circuit processes the detection signal and detects the acceleration caused in the semiconductor device 1. Specifically, the semiconductor device 1 is a part of an acceleration detection apparatus that detects the acceleration based on the change of the electrostatic capacitance between the movable electrode 21 and the fixed electrode 30. As shown in FIG. 4, the signal processing circuit may be arranged on the same chip as a chip on which the semiconductor device 1 is arranged, or may be arranged on a different chip from the chip on which the semiconductor device 1 is arranged.

An electrode wire 61 for transmitting a voltage value of the movable electrode 21 to the signal processing circuit is brought into contact with the oscillator 20 in an opening portion formed by removing a part of the upper insulating film 54. Meanwhile, electrode wires 62 for transmitting voltage values of the fixed electrodes 30 to the signal processing circuit are brought into contact with the fixed electrodes 30 in opening portions 620 formed by partially removing the upper insulating films 54.

In the semiconductor device 1 shown in FIG. 1, the movable electrode 21 and the fixed electrodes 30 are arranged in an interdigital fashion. In such a way, opposed areas of the movable electrode 21 and the fixed electrodes 30 are increased, and the electrostatic capacitance between the movable electrode 21 and the fixed electrodes 30 is increased. Hence, the acceleration can be detected with high sensitivity. In a region where the oscillator 20 and the fixed electrodes 30 are opposed to each other, widths of the oscillator 20 and the fixed electrodes 30 approximately range, for example, from 3 µm to 10 µm, and the distances between the oscillator 20 and the fixed electrodes 30 approximately range, for example, 1 µm to 2 µm.

When the position of the oscillator 20 is changed by the external force, the movable electrode 21 sometimes contacts the bottom surface of the recessed portion 100. The semiconductor layer that composes the semiconductor substrate 10 is exposed to the bottom surface of the recessed portion 100. Therefore, in the case where the insulating film is not arranged on the lower surface of the movable electrode 21, the movable electrode 21 and the semiconductor substrate 10 electrically short-circuit with each other, are fixedly adhered to each other, and so on. As a result, a problem occurs that the change of the electrostatic capacitance between the movable electrode 21 and the fixed electrodes 30 cannot be detected accurately.

In order to solve the above-described problem, there is considered a method of forming the recessed portion 100 deeply, and increasing a distance between the movable electrode 21 and the bottom surface of the recessed portion 100. However, when the recessed portion 100 is formed deeply, in the case where displacement of the oscillator 20 is large, the movable electrode 21 enters a lower side of the fixed electrode 30 adjacent thereto, causing a problem that the movable electrode 21 and the fixed electrode 30 are superposed up and down on each other and contact each other.

However, in the semiconductor device 1 according to the embodiment of the present invention, the lower insulating film 50 is arranged on the lower surface of the movable electrode 21. Therefore, even if the movable electrode 21 contacts the bottom surface 101 of the recessed portion 100, there does not occur the problem that the movable electrode 21 and the semiconductor substrate 10 electrically short-circuit with each other, are fixedly adhered to each other, and so on. Moreover, it is not necessary to form the recessed portion 100 deeply, and accordingly, there does not occur the problem that the movable electrode 21 and the fixed electrode 30 are superposed on each other, either.

Moreover, when the insulating film, a conductor film or the like is arranged on the movable electrode 21, the movable electrode 21 is sometimes warped in a thickness direction depending on a layer structure on the movable electrode 21. However, in the semiconductor device 1 shown in FIG. 1, the lower insulating film 50 is arranged on the lower surface of the movable electrode 21, and accordingly, a material and film thickness of the lower insulating film 50 are selected appropriately, whereby the warp of the movable electrode 21 in the thickness direction can be prevented. Alternatively, in order to realize desired warp amounts and warp directions of the movable electrode 21 and the fixed electrode 30, the material and film thickness of the lower insulating film 50 may be selected in consideration of a material, film thickness and the like of the upper insulating film 54.

As described above, in accordance with the semiconductor device 1 according to the embodiment of the present invention, the lower insulating film 50 is arranged on the lower surface of the movable electrode 21, whereby the semiconductor device in which the short circuit between the oscillator 20 and the semiconductor substrate 10 is prevented can be realized.

Figure 7:
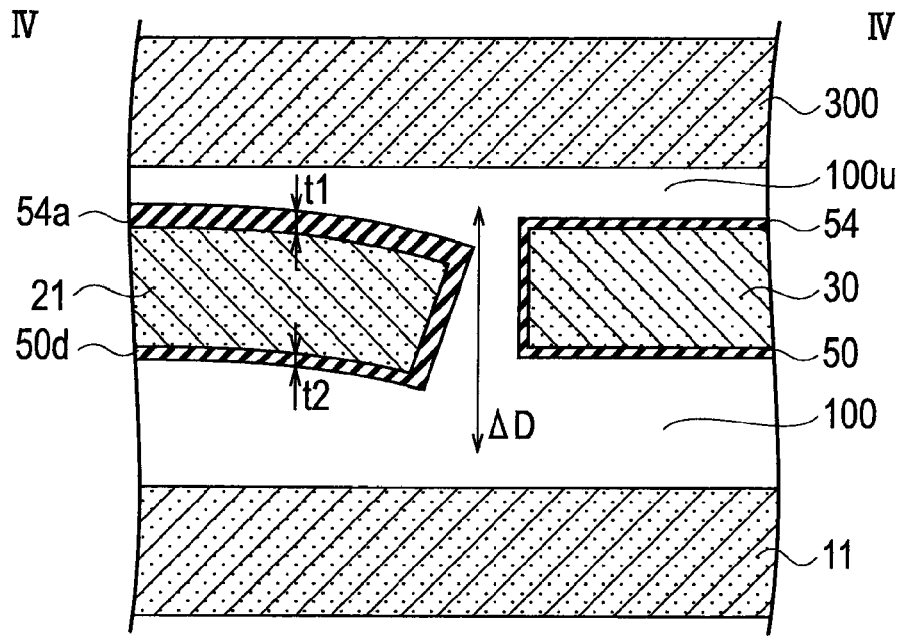
FIG. 7 is a schematic cross-sectional structure view along a line IV-IV of FIG. 4, showing an example of a schematic cross-sectional structure of a vicinity of a movable electrode and fixed electrode of the semiconductor device according to the embodiment.
Figure 8:
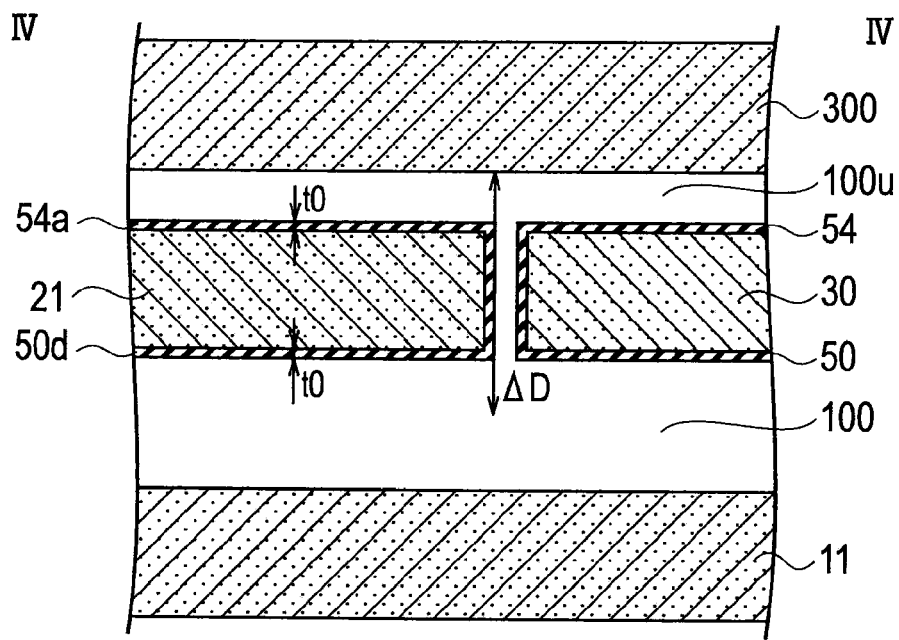
FIG. 8 is a schematic cross-sectional structure view along the line IV-IV of FIG. 4, showing another example of the schematic cross-sectional structure of the vicinity of the movable electrode and fixed electrode of the semiconductor device according to the embodiment.

A schematic cross-sectional structure along a line IV-IV of FIG. 4, showing an example of a schematic cross-sectional structure of a vicinity of the movable electrode 21 and fixed electrode 30 of the semiconductor device 1 according to the embodiment, is illustrated as shown in FIG. 7. In the example of FIG. 7, a structure is provided, in which the movable electrode 21 opposed to the fixed electrode 30 is warped downward. For example, in the case where an oxide film is used as the insulating film, the movable electrode 21 is formed so that a thickness t1 of the upper insulating film 54 of the movable electrode 21 can be thicker than a thickness t2 of a lower insulating film 50d, whereby the structure in which the movable electrode 21 is warped downward can be formed. In the example of FIG. 7, in the case where the electrode is displaced up and down by ΔD owing to an unexpected impact and the like, a possibility that contact between the movable electrode 21 and the cover film 300 can be avoided is increased as compared with the case of FIG. 8, where the structure in which the movable electrode 21 is warped is not provided.

(Fabrication Method)

A description is made below of a method of fabricating the semiconductor device 1 according to the embodiment of the present invention with reference to FIG. 9 to FIG. 16. FIG. 9 to FIG. 16 are cross-sectional views at the same position as in FIG. 3. Note that the method of fabricating the semiconductor device 1, which is described below, is merely an example, and it is a matter of course that the semiconductor device 1 is realizable by other various fabrication methods including modification examples of the method to be described below.

Figure 9:
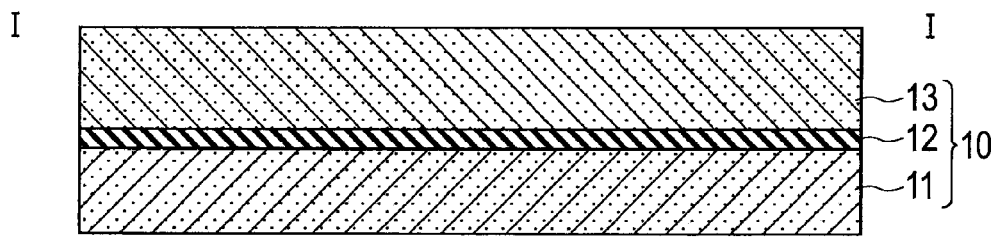
FIG. 9 is a process cross-sectional view for explaining a method of fabricating the semiconductor device according to the embodiment (No. 1).

(a) First, as shown in FIG. 9, the semiconductor substrate 10 with the structure in which the lower semiconductor layer 11, the interlayer insulating layer 12 and the upper semiconductor layer 13 are stacked on one another is prepared. For example, the semiconductor substrate 10 has a structure, in which the interlayer insulating layer 12 with a film thickness approximately ranging from 0.1 μm to 0.5 μm is formed on the lower semiconductor layer 11 with a film thickness of approximately 300 μm, and the upper semiconductor layer 13 with a film thickness approximately ranging from 5 μm to 100 μm is stacked on the interlayer insulating layer 12. For example, the lower semiconductor layer 11 is formed of the silicon film, the interlayer insulating layer 12 is formed of a stacked body of the $SiO_2$ film and the SiN film, and the upper semiconductor layer 13 is formed of the silicon film.

Figure 10:
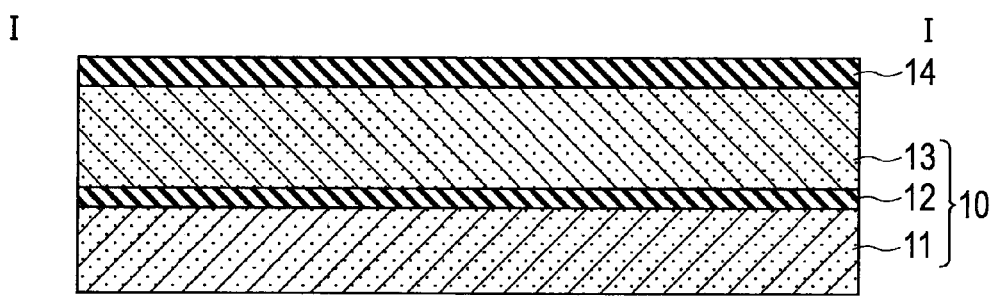
FIG. 10 is a process cross-sectional view for explaining the method of fabricating the semiconductor device according to the embodiment (No. 2).

(b) Next, as shown in FIG. 10, by using a thermal oxidation method, a chemical vapor deposition (CVD) method or the like, the upper insulating film 14 with a film thickness approximately ranging from 0.5 μm to 2.0 μm is formed on the semiconductor substrate 10. For the upper insulating film 14, the $SiO_2$ film or the stacked body of the $SiO_2$ film and the SiN film is adoptable.

Figure 11:
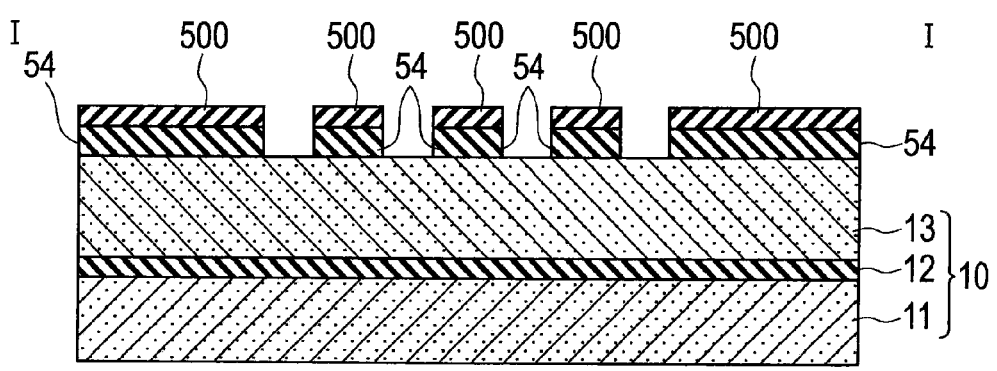
FIG. 11 is a process cross-sectional view for explaining the method of fabricating the semiconductor device according to the embodiment (No. 3).

(c) Next, as shown in FIG. 11, a photoresist film 500 is formed on the upper insulating film 14, and the photoresist film 500 is formed into a desired pattern by using a photolithography technology. Specifically, the photoresist film 500 on a region in which the recessed portion 100 and the insulating isolation regions 40 are formed is removed, and the photoresist film 500 on a region in which the oscillator 20 and the fixed electrodes 30 are formed is left. Then, by selective etching using this photoresist film 500 as a mask, a part of the upper insulating film 14 is removed, and the plurality of upper insulating films 54 are formed on the semiconductor substrate 10 as shown in FIG. 11. Thereafter, the photoresist film 500 is removed.

Figure 12:
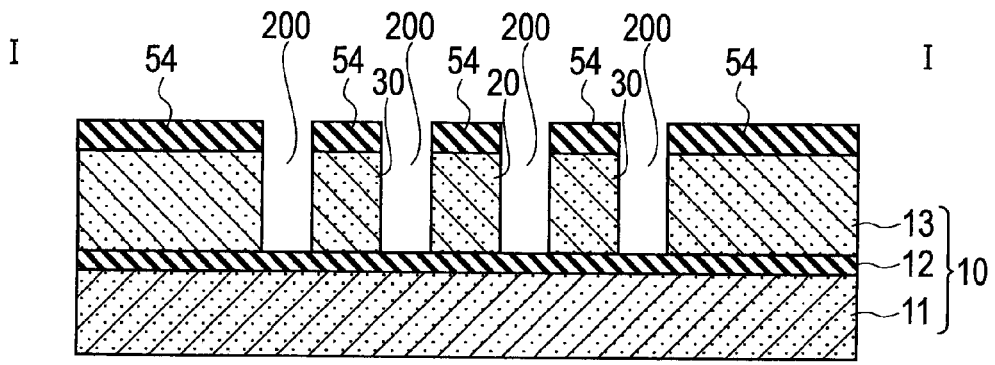
FIG. 12 is a process cross-sectional view for explaining the method of fabricating the semiconductor device according to the embodiment (No. 4).

(d) Next, as shown in FIG. 12, by selective etching using the upper insulating films 54 as etching masks, a part of the upper semiconductor layer 13 is removed by etching, whereby a side trench 200 is formed, and the side surfaces of the oscillator 20 and the fixed electrodes 30 are exposed. A depth of the side trench 200 is equivalent to the film thickness of the upper semiconductor layer 13, and for example, approximately ranges from 5 μm to 100 μm. For the etching for forming the side trench 200, a Bosch process using a deep reactive ion etching (D-RIE) method is adoptable.

Figure 13:
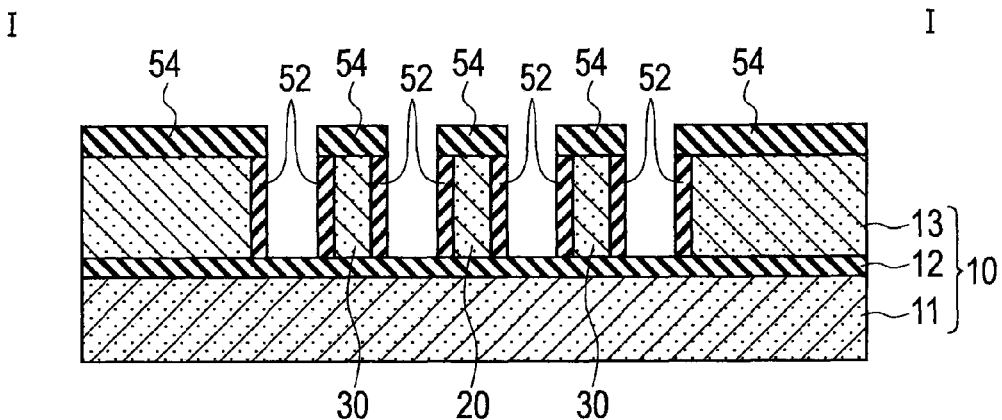
FIG. 13 is a process cross-sectional view for explaining the method of fabricating the semiconductor device according to the embodiment (No. 5).

(e) Next, as shown in FIG. 13, the side insulating film 52 is formed on a surface of the side trench 200. The side insulating film 52 is formed of an insulating film with a film thickness, for example, approximately ranging from 0.1 μm to 1 μm, such as the $SiO_2$ film and a low pressure tetraethoxysilane (LPTEOS) film as a type of the $SiO_2$ film. The thermal oxidation method and the CVD method are usable for forming the side insulating film 52.

Figure 14:
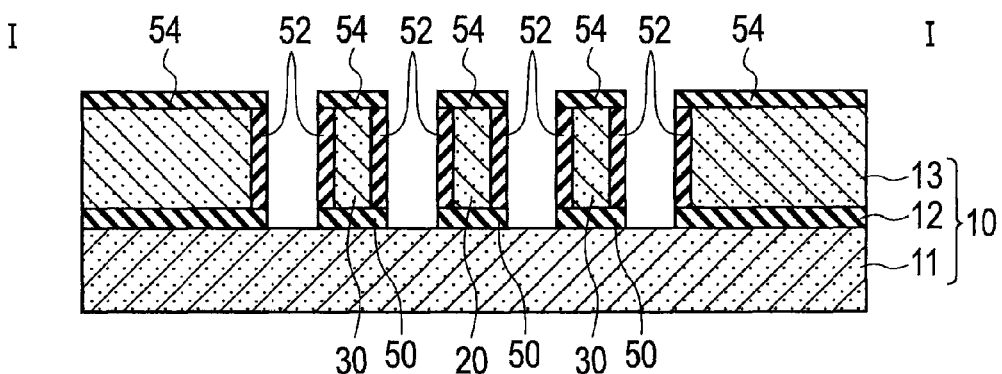
FIG. 14 is a process cross-sectional view for explaining the method of fabricating the semiconductor device according to the embodiment (No. 6).

(f) Next, as shown in FIG. 14, by anisotropic etching, the interlayer insulating layer 12 exposed to the bottom surface of the side trench 200 is removed. In such a way, a surface of the lower semiconductor layer 11 is exposed. Moreover, the interlayer insulating layer 12 located on the lower surfaces of the oscillator 20 and the fixed electrodes 30 is left, and the interlayer insulating layer 12 thus left serves as the lower insulating films 50. Note that, when the interlayer insulating layer 12 is removed by etching, the upper insulating films 54 are etched simultaneously. Therefore, it is necessary that the film thickness of the upper insulating films 54 be made thicker than that of the interlayer insulating layer 12.

Figure 15:
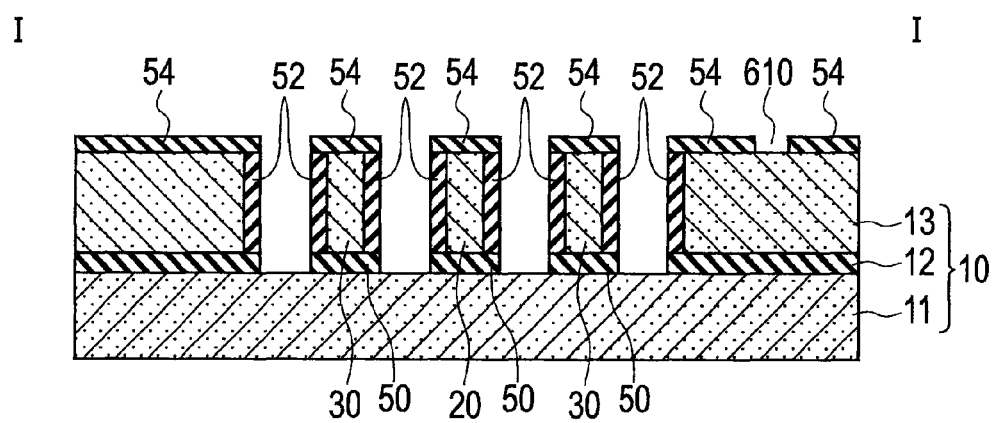
FIG. 15 is a process cross-sectional view for explaining the method of fabricating the semiconductor device according to the embodiment (No. 7).

(g) Next, as shown in FIG. 15, opening portions 610 and 620 are formed by using the photolithography technology and the like. For example, a photoresist film is formed on the entire surface of the semiconductor substrate 10, and thereafter, the photoresist film on regions in which the opening portions 610 and 620 are formed is removed. By using this photoresist film as a mask, the upper insulating film 54 is removed by etching, whereby the opening portions 610 and 620 are formed.

Figure 16:
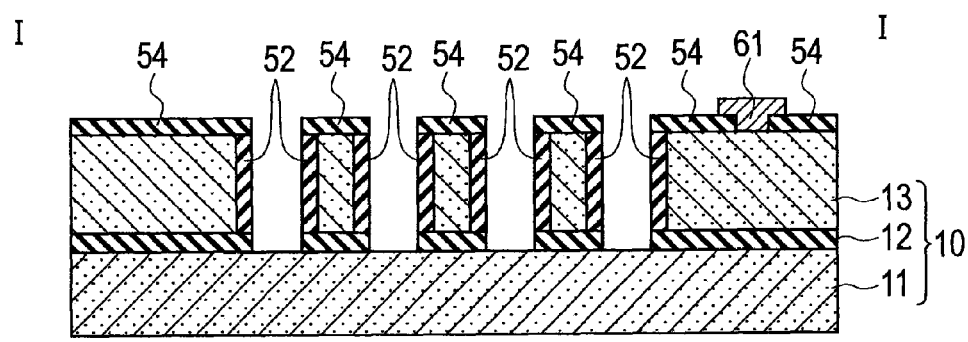
FIG. 16 is a process cross-sectional view for explaining the method of fabricating the semiconductor device according to the embodiment (No. 8).
Figure 17:
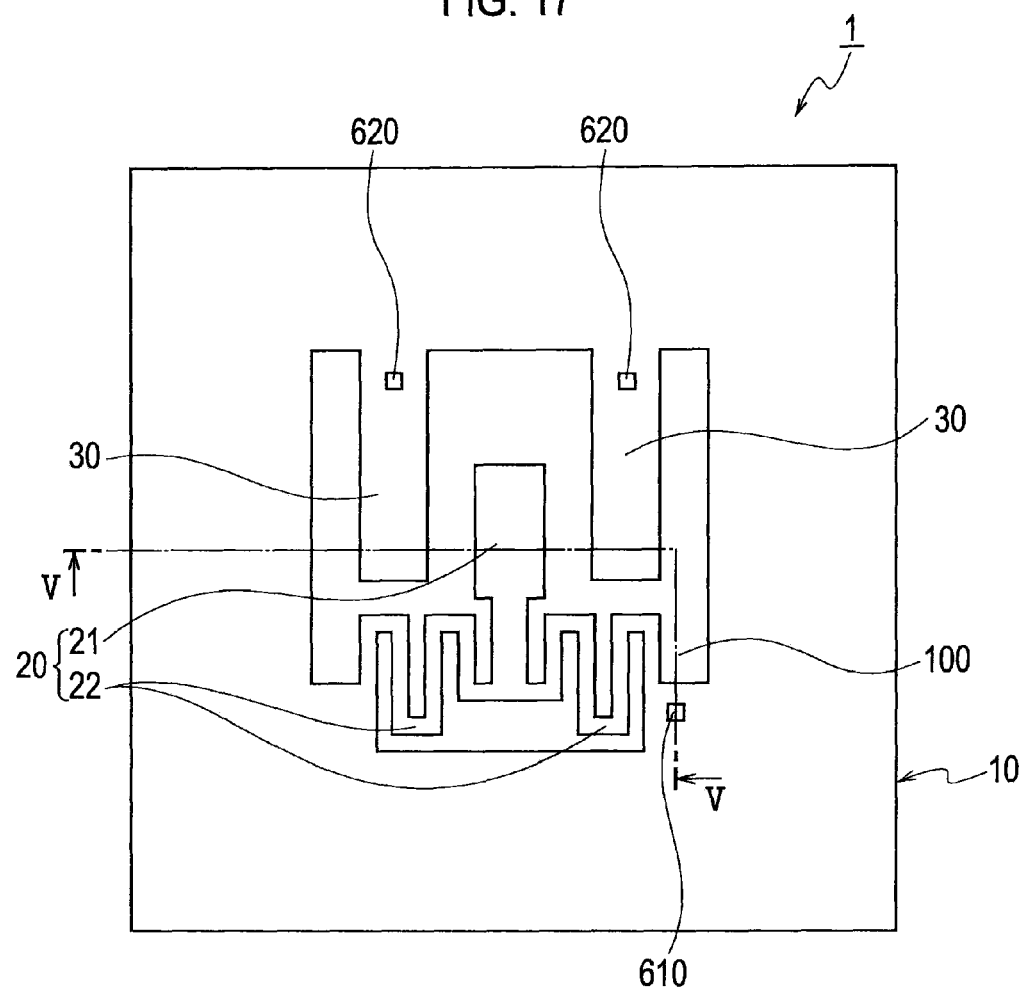
FIG. 17 is a plan view for explaining the method of fabricating the semiconductor device according to the embodiment.

(h) Next, as shown in FIG. 16, the electrode wires 61 and 62 are formed. For example, a photoresist film is formed on the entire surface of the semiconductor substrate 10, and thereafter, the photoresist film on regions in which the electrode wires 61 and 62 are arranged is removed, whereby the photoresist film is formed into a desired pattern. Thereafter, an aluminum (Al) film is coated on the entire surface of the semiconductor substrate 10, for example, by a sputtering method and the like, and the electrode wires 61 and 62 with the desired pattern are formed by a lift-off method of removing the photoresist film. FIG. 17 shows a plan view of the semiconductor device 1 in a state where the opening portions 610 and 620 are formed. A cross-sectional view along a direction V-V of FIG. 17 corresponds to FIG. 15.

(i) Next, as shown in FIG. 2, by using the side insulating film 52 and the lower insulating films 50 as masks, a part of an upper portion of the lower semiconductor layer 11 is etched by isotropic etching. In such a way, the lower surfaces of the oscillator 20 and the fixed electrodes 30, on which the lower insulating films 50 are arranged, are exposed. For example, in the case where the lower semiconductor layer 11 is the silicon layer, an isotropic etcher using sulfur hexafluoride ($SF_6$) gas, and the like are usable. By the etching for the lower semiconductor layer 11, the recessed portion 100 is formed on the upper surface of the semiconductor substrate 10, and the oscillator 20 and the fixed electrode 30 are arranged in the recessed portion 100. The lower semiconductor layer 11 is exposed to the bottom surface 101 of the recessed portion 100.

(j) Next, as shown in FIG. 3 and FIG. 4, the cover film 300 such as a silicon substrate is arranged on the upper portion of the semiconductor device 1 while interposing the insulating layer 250 therebetween at the peripheral portion of the semiconductor substrate 10, whereby the semiconductor device 1 is sealed. The recessed portion 100 may be evacuated to vacuum, or nitrogen gas, Ar gas or the like may be hermetically sealed thereinto. Here, the insulating layer 250 is a layer for adhering the semiconductor substrate 10 and the cover film 300 to each other. For example, as a material of the insulating layer 250, there is mentioned a glass paste, thermoplastic resin, thermosetting resin, UV curing resin or the like. Preferably, it is recommended to use the thermoplastic resin. As the thermoplastic resin, for example, there is mentioned resin such as vinyl chloride resin, polyethylene, polypropylene, acrylic resin, polyethylene terephthalate, polyamide, and polycarbonate. As the thermosetting resin, there are mentioned epoxy resin, phenol resin, polyurethane resin, melamine resin, and the like. Moreover, as the UV curing resin, there are mentioned acrylic resin, epoxy resin, polyester resin, and the like. In such a manner as described above, the semiconductor substrate 1 is completed.

Figure 18:
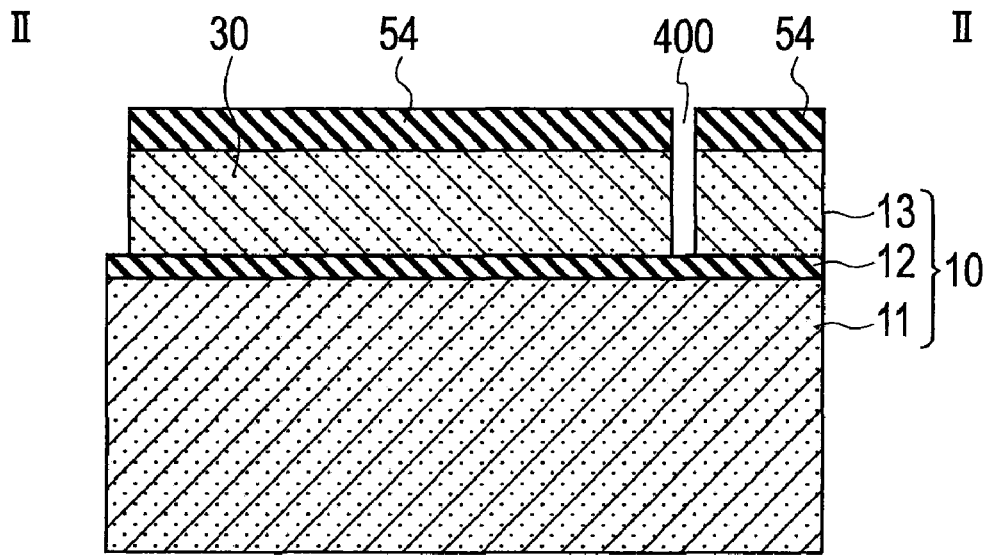
FIG. 18 is a process cross-sectional view for explaining another method of fabricating the semiconductor device according to the embodiment, showing a cross section along the line II-II of FIG. 1 in a same process step as in FIG. 12 (No. 1).
Figure 19:
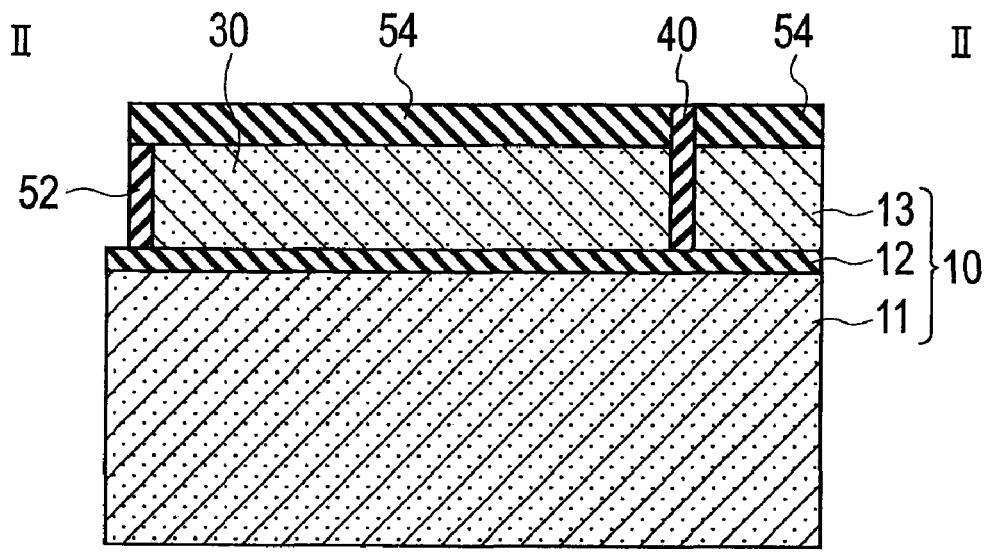
FIG. 19 is a process cross-sectional view for explaining another method of fabricating the semiconductor device according to the embodiment, showing a cross section along the line II-II of FIG. 1 in a same step as in FIG. 13 (No. 2).

Note that, as shown in FIG. 18, insulating isolation trenches 400 are formed at the same time of the formation of the side trench 200, which is described with reference to FIG. 12. Here, FIG. 18 corresponds to a schematic cross-sectional structure along the line II-II of FIG. 1 in the same process step as in FIG. 12. Then, at the same time of the formation of the side insulating film 52, which is described with reference to FIG. 13, the insulating isolation trenches 400 are filled with the insulating film as shown in FIG. 19, whereby the insulating isolation regions 40 are formed. Here, FIG. 19 corresponds to the schematic cross-sectional structure along the line II-II of FIG. 1 in the same process step as in FIG. 12.

However, the side trench 200 may be formed in a different step from that for the insulating isolation trenches 400. Moreover, the side insulating film 52 and the insulating isolation regions 40 may be formed in different steps from each other.

As described above, the lower insulating films 50 are formed by etching a part of the interlayer insulating layer 12. A material and film thickness of the interlayer insulating layer 12 are arbitrarily settable, whereby the warp amounts and warp directions of the movable electrode 21 and the fixed electrode 30 are adjustable. For example, a film structure formed on the upper surfaces of the movable electrode 21 and the fixed electrodes 30 and a film structure formed on the lower surfaces thereof are set the same, whereby the upper surface of the movable electrode 21 and the upper surfaces of the fixed electrodes 30 can be made flush with each other. As a result, the opposed areas of the movable electrode 21 and the fixed electrodes 30 become the maximum, and the detection sensitivity can be enhanced. As described above, it is preferable to decide the material and film thickness of the upper insulating film 54 in response to the desired warp amounts and warp directions of the movable electrode 21 and the fixed electrodes 30 in consideration of the material and film thickness of the upper insulating film 54 arranged on the upper surfaces of the movable electrode 21 and the fixed electrodes 30.

For example, the material and film thickness of the interlayer insulating layer 12 are selected appropriately, whereby it is also possible to warp the movable electrode 21 and the fixed electrodes 30 downward toward the bottom surface 101 of the recessed portion 100. The movable electrode 21 is warped downward, whereby the movable electrode 21 can be prevented from contacting the cover film (not shown) that covers the upper portion of the recessed portion 100. For example, the stacked body of the $SiO_2$ film and the SiN film is adopted for the interlayer insulating layer 12, and the $SiO_2$ film is adopted for the upper insulating film 14.

As described above, in accordance with the method of fabricating the semiconductor device 1 according to the embodiment, the semiconductor substrate 10 itself is etched, whereby the oscillator 20 is arranged in the recessed portion 100. Therefore, a forming step and patterning step of a sacrifice layer for isolating the oscillator 20 and the semiconductor substrate 10 from each other are not required, and an increase of fabrication steps can be suppressed.

Moreover, the lower surfaces of the oscillator 20 and the fixed electrodes 30 are covered with the lower insulating films 50 in the isotropic etching for forming the recessed portion 100. Therefore, the lower surfaces of the oscillator 20 and the fixed electrodes 30 are prevented from being etched in the above-described anisotropic etching. Hence, the oscillator 20 and the fixed electrodes 30 are prevented from being thinned, and the opposed areas of the movable electrode 21 and the fixed electrodes 30 are suppressed from being reduced. As a result, the detection sensitivity is enhanced as compared with a detection apparatus in which the lower insulating films 50 are not arranged on the lower surfaces of the oscillator 20 and the fixed electrodes 30.

In accordance with the method of fabricating the semiconductor device 1 according to the embodiment, which is as described above, the lower insulating films 50 are formed on the lower surfaces of the oscillator 20 and the fixed electrodes 50, whereby a semiconductor device can be provided, in which the short circuit between the oscillator 20 and the semiconductor substrate 10 is prevented, and the increase of the fabrication steps can be suppressed.

Other Embodiments

As mentioned above, the present invention has been described based on the embodiment; however, it should not be understood that the description and the drawings, which form a part of the disclosure, limit this invention. From this disclosure, a variety of alternative embodiments, examples and operation technologies will be obvious for those skilled in the art.

In the description of the embodiment, which has been already made, the example where the semiconductor device is applied for the acceleration sensor is illustrated. However, the usage purpose of the semiconductor device is not limited to the acceleration sensor, and the semiconductor device is usable for a variety of sensors which detect a physical quantity based on the change of the electrostatic capacitance between the movable electrode 21 and the fixed electrodes 30 by using a structure displaced in response to the external force, and the like. For example, the present invention is also applicable for an angular velocity sensor, a pressure sensor, a force sensor and the like.

As described above, it is a matter of course that the present invention incorporates a variety of embodiments and the like, which are not described herein. Hence, the technical scope of the present invention should be determined only by the invention specifying items according to the scope of claims reasonable from the above description.

INDUSTRIAL APPLICABILITY

The semiconductor device of the present invention and the method of fabricating the semiconductor device concerned are usable for an electronic instrument industry including a fabrication industry that fabricates a semiconductor sensor having a movable portion.

What is claimed is:

1. A semiconductor device comprising:
a semiconductor substrate, in which a recessed portion is formed on an upper surface, and a semiconductor layer is exposed to a bottom surface of the recessed portion;
an oscillator that includes a beam-type movable electrode arranged in the recessed portion so as to be opposed to a surface of the semiconductor layer, the movable electrode having insulating films arranged on side surfaces and lower surface thereof, and is fixed to the semiconductor substrate at a position apart from the movable electrode; and
a beam-type fixed electrode that is arranged in the recessed portion so as to be opposed to the movable electrode and the surface of the semiconductor layer, and is fixed to the semiconductor substrate so as to be electrically isolated from the movable electrode,
wherein a connection portion between the oscillator and the semiconductor substrate has a spring shape having flexibility, and the spring-shaped connection portion supports only one side of the beam-type movable electrode.

2. The semiconductor device according to claim 1, wherein the movable electrode and the fixed electrode are arranged in an interdigital fashion.

3. The semiconductor device according to claim 1, further comprising:
an insulating isolation region arranged between the fixed electrode and the semiconductor substrate.

4. The semiconductor device according to claim 1, further comprising:
an insulating isolation region arranged between the movable electrode and the semiconductor substrate.

5. The semiconductor device according to claim 1, wherein the semiconductor substrate includes a stacked body of a lower semiconductor layer, an interlayer insulating layer and an upper semiconductor layer.

6. The semiconductor device according to claim 1, further comprising:
insulating films arranged on side surfaces and lower surface of the fixed electrode.

7. The semiconductor device according to claim 1, further comprising:
insulating films arranged on upper surfaces of the fixed electrode and the movable electrode.

8. The semiconductor device according to claim 1, wherein either one of the movable electrode or the fixed electrode is displaced downward.

9. The semiconductor device according to claim 1, further comprising:
a cover film that is arranged on the semiconductor substrate and seals the semiconductor device.

10. The semiconductor device according to claim 1, further comprising:
a signal processing circuit that is arranged on a same chip as a chip on which the semiconductor device is arranged, and drives the semiconductor device.

11. The semiconductor device according to claim 1, wherein at least two spaces between electrodes which detect changes of electrostatic capacitance are provided, in a case where external force is applied to the semiconductor device, the electrostatic capacitance is increased in one of the spaces between the electrodes, and the electrostatic capacitance is reduced in the other space between the electrodes, and a difference between the increased electrostatic capacitance and the reduced electrostatic capacitance is outputted as a signal.

12. The semiconductor device according to claim 1, wherein the spring-shaped connection portion supports the movable electrode so as to sandwich the beam-type movable electrode.

13. The semiconductor device according to claim 1, wherein the spring-shaped portion is in a shape, of a meandering path.

14. The semiconductor device according to claim 13, wherein the spring-shaped portion meanders back and forth multiple times.

* * * * *